United States Patent
Zhang et al.

(10) Patent No.: US 6,178,215 B1
(45) Date of Patent: Jan. 23, 2001

(54) SYNCHRONIZATION SYSTEM FOR REDUCING SLIPPING

(75) Inventors: Genzao Zhang, Vanier; Roland Smith, Nepean; Dan Oprea, Kanata; Roger Ferland, Gatineau, all of (CA)

(73) Assignee: Nortel Networks Limited, Montreal (CA)

(*) Notice: Under 35 U.S.C. 154(b), the term of this patent shall be extended for 0 days.

(21) Appl. No.: 08/997,981

(22) Filed: Dec. 24, 1997

(30) Foreign Application Priority Data

Oct. 9, 1997 (CA) .................................................. 2217840

(51) Int. Cl.⁷ .................................................. H04L 25/36
(52) U.S. Cl. .......................... 375/371; 455/260; 375/362
(58) Field of Search ................................. 375/352, 354, 375/357, 359, 362, 371, 373, 375, 376, 294; 329/319, 325; 331/17; 327/147, 148; 455/182.2, 192.2, 208, 255, 256, 257, 258, 260, 264, 265

(56) References Cited

U.S. PATENT DOCUMENTS

| | | |
|---|---|---|
| 4,374,438 | 2/1983 | Crowley . |
| 4,380,743 | 4/1983 | Underhill et al. . |
| 4,674,088 | 6/1987 | Grover . |
| 5,402,446 | 3/1995 | Minami . |
| 5,559,842 * | 9/1996 | Javitt .................................... 375/376 |
| 5,598,448 * | 1/1997 | Girardeau, Jr. ..................... 375/376 |
| 5,648,964 * | 7/1997 | Inagaki et al. ..................... 370/228 |
| 5,673,004 * | 9/1997 | Park ................................. 331/1 A |
| 5,764,709 * | 6/1998 | Whiteside .......................... 375/375 |
| 5,790,613 * | 8/1998 | Tateishi ............................. 375/376 |
| 5,812,618 * | 9/1998 | Muntz et al. ...................... 375/372 |
| 5,889,829 * | 3/1999 | Chiao et al. ....................... 375/376 |
| 5,929,921 * | 7/1999 | Taniguchi et al. ................. 348/484 |
| 5,933,058 * | 8/1999 | Pinto et al. ......................... 331/17 |
| 5,966,387 * | 10/1999 | Cloutier ............................. 370/516 |
| 5,982,833 * | 11/1999 | Waters ............................... 375/372 |
| 5,982,835 * | 11/1999 | Kim et al. .......................... 375/376 |
| 5,995,570 * | 11/1999 | Onvural et al. .................... 375/356 |

* cited by examiner

Primary Examiner—Chi H. Pham
Assistant Examiner—Emmanuel Bayard
(74) Attorney, Agent, or Firm—Jeff Measures

(57) ABSTRACT

An improved local synchronization module which uses Frequency-phase adaptive double locked loop (FPADLL) to control a stable controllable oscillator is disclosed. A single physical feedback loop is implemented which can operate in either a phase locked loop mode or a frequency locked loop mode. The sync module includes a controller which determines in which mode the feedback loop operates. The controller also uses slipping information from a network reference recovery interface to reduce slipping. Also effects of ageing of the stable controllable oscillator are predicted and compensated for.

15 Claims, 13 Drawing Sheets

Note: $\Delta\phi(n)=\phi(n)-\phi(n-1)$, where $\phi(n)$ is the phase difference signal from the phase detector.

| State Number:k N=10 | Number of φ(n) Samples involved by Filter | Filter Period | $f_{er}(n)$ Threshhold Values | $φ_{er}(n)$ Threshhold Values |
|---|---|---|---|---|
| 1 | 1 | 16ms | Th_f1=2 | Th_φ1=128 |
| 2 | 2 | 32ms | Th_f2=3 | Th_φ2=256 |
| 3 | 4 | 64ms | Th_f3=5 | Th_φ3=512 |
| 4 | 8 | 128ms | Th_f4=10 | Th_φ4=1024 |
| 5 | 16 | 256ms | Th_f5=20 | Th_φ5=2048 |
| 6 | 32 | 512ms | Th_f6=39 | Th_φ6=4096 |
| 7 | 64 | 1.024s | Th_f7=77 | Th_φ7=8192 |
| 8 | 128 | 2.048s | Th_f8=130 | Th_φ8=16384 |
| 9 | 256 | 4.096s | Th_f9=150 | Th_φ9=32768 |
| 10 | 512 | 8.192s | Th_f10=167 | Th_φ10=65536 |

FIG. 14

SYNCHRONIZATION SYSTEM FOR REDUCING SLIPPING

RELATED APPLICATIONS

The present application is related to U.S. patent application Ser. No. 08/997,834, filed Dec. 24, 1997, with title Improved Synchronization System Using Multiple Modes of Operation, and U.S. patent application Ser. No. 08/997,983, filed Dec. 24, 1997, with title Improved Synchronization System Using Aging Prediction, each filed concurrently herewith, now U.S. Pat. Nos. 6,073,031 and 6,104,915 respectively.

FIELD OF THE INVENTION

The present invention relates to network clock reference synchronization.

BACKGROUND OF THE INVENTION

Many networks require strict synchronization (Sync) between network elements for proper performance. For example, digital wireless communication systems (cellular or PCS), referred to below as wireless systems, are dependent upon strict synchronization between the base station system (BSS); terminals, e.g., mobile handsets or mobile stations (MS); and other network elements. The BSS system typically includes a base station controller (BSC) and multiple base transceiver stations (BTS).

If sufficient synchronization is not obtained in the BTS or the BSC, the quality of the communication links can be compromised. As example of the importance of synchronization, it has been found that the speed of handover or handoff operation, the call drop rate, and the link quality, of a mobile system are directly or indirectly dependent upon the performance of the system synchronization. Cellular or PCS radio system performance is significantly restrained by its systems synchronization in two aspects:

i) phase accuracy, and ii) frequency accuracy.

With respect to aspect (i), improving phase accuracy (ie., reducing phase differences between the recovered clock and the local synchronization module output clock) will result in a lower frame slipping rate at the BTS network interface, and thus better traffic link quality.

With respect to aspect (ii), improving the frequency accuracy of the local synchronization module output clock will result in faster handovers, lower handover and camping-in call block rates, and lower radio system interference levels. Thus, both of these 2 aspects are important for obtaining desirable link quality and systems performance. Note that as well as the accuracy, the stability of the signal is also important.

For the purpose of synchronisation, in each BTS and BSC, a synchronisation module is required and defined in various of radio technologies (such as GSM, CDMA and TDMA). For example, for GSM, the synchronisation in each BTS is required as:

"The BTS shall use a single frequency source of absolute accuracy better than 0.05 PPM for both RF frequency generation and clocking time base. The same source shall be used for all carriers of the BTS."

There are three basic methods to implement the synchronisation:

1. GPS method: Put a global positioning system (GPS) receiver in each of BTSs and BSCs;
2. Fixed frequency method: Use a very accurate and fixed frequency source, for example an oven-controlled crystal oscillator (OCXO) in each of BTSs and BSCs for the independent clock source;
3. Local Sync module method: Use a stable controllable crystal oscillator such as an oven-controlled voltage-controlled crystal oscillator (OCVCXO) to implement either a phase locked loop (PLL) or a frequency locked loop (FLL) in each of BTSs and BSCs so that the locally generated reference is locked (either in phase or frequency) to the public switched telephone network (PSTN) network clock source.

Using a GPS receiver has a very high cost and is generally limited to outdoor mobile systems due to the need for an antenna which can receive GPS satellite transmissions.

Using a very stable and accurate OCXO as an independent clock source in each BTS and BSC is also costly and requires a regular tuning step (once per year or per two years). Such a tuning step typically requires sending a technician to each module, which is inconvenient and costly.

Thus the third method is preferable from a cost and maintenance requirement. However, it is typically less accurate than the other two methods as it is difficult to achieve an accurate lock (either in phase or frequency) to the PSTN reference. Furthermore, even if the locally generated reference is accurately locked to the network, this does not necessarily provide a sufficiently accurate reference as the PSTN reference clock may itself drift over time. The clock recovered from the PSTN suffers phase and frequency variations or drifts caused by multiple factors, for example, jitters, wanders, phase transients, VT (virtual tributary) transients, high level clock source switchovers, high level clock module holdover, free running, etc. Thus, in practice this third method has until now been seen as a compromise between the cost and the synchronisation quality (accuracy and stability).

As stated, prior art solutions use either a PLL or an FLL to lock the local reference to the PSTN reference in either phase or frequency. A PLL is effective with respect to aspect i). However, such a PLL can lock in phase, but tends to result in a frequency drift.

In some situations, a locally generated reference which is phase locked to the network in the local synchronisation module suffers sufficient frequency drift that the frequency stability and accuracy (in the BTS or BSC) will fail to meet the radio specification requirement.

However, if a FLL is used to achieve aspect (ii), the phase tends to drift. This tends to result in increased frame slipping, and thus decreases the traffic link quality.

Thus, there exists a need for a synchronisation module which can locally generate a reference signal which overcomes these and other problems.

SUMMARY OF THE INVENTION

An aspect of this invention provides an improved local synchronisation system which uses a feed-back loop to control a controllable signal source, such as an OCVCXO, such that signal differences between the local signal and a reference signal are controlled both with respect to frequency and phase.

Another aspect of this invention provides an improved local synchronisation system which has multiple modes of operation. The multiple mode of operations include initialization, FLL, PLL, and open loop modes, wherein each mode of operation has a series of boundary conditions for adjusting between modes.

Another aspect of this invention provides an improved local synchronisation system which uses multiple boundary conditions to control both the phase and frequency characteristics.

Another aspect of this invention provides an improved local synchronisation system which controls phase errors in order to minimize slipping.

Another aspect of this invention provides an improved local synchronisation system which compensates for aging affects of said controllable signal source.

Another aspect of this invention provides an improved local synchronisation system an improved local synchronisation system which uses a Frequency-Phase Adaptive Double Locked Loop (FPADLL) to control both the phase and frequency characteristics.

In a preferred embodiment of the invention, the Sync system does not physically include a double lock loop which simultaneously locks both the phase and frequency of the stable OCVCXO reference clock. Rather, a single physical feedback loop is implemented which can operate in multiple modes of operation, for example, either a phase locked loop mode or a frequency locked loop mode. The Sync system includes a controller which determines in which mode the feedback loop operates.

Another aspect of the invention is generally applicable to sync systems which control a locally controllable oscillator by means of a feed back loop (eg. a phase lock loop or a frequency lock loop) and a reference signal. In general, such a feed back loop continuously compensates for variations in the output characteristics (e.g., frequency or phase) of the oscillator by locking either the frequency or phase of the oscillator output to that of the reference signal. Typically the variations in the output characteristics of oscillator are due to long term changes in the OCVCXO characteristics due to such environmental conditions as temperature, humidity, pressure and power supply variations (hereafter referred to as aging).

However, such a system will fail to compensate for oscillator drift in the event that the system fails to recover a suitable reference signal (either because the input is lost or becomes inaccurate/unstable, or due to some system failure, for example a failure in the recovery unit itself). Therefore, another aspect of the invention allows such a system to operate in an open loop mode by compensating for expected oscillator drift in the event that actual drifts from a suitable reference signal can not be measured. Accordingly, the system maintains records of how it has compensated the oscillator during normal operation, and uses this history to predict the compensation needed for expected drifts. Advantageously, these records can also be used to more quickly initialize the system after a power outage or other reset than could otherwise be achieved using conventional feedback control alone.

According to a preferred embodiment, the system operates a feed back loop to maintain the output characteristic(s) within boundary conditions (for example, stepped thresholds on the phase and/or frequency differences). These boundary conditions can also include conditions on the reference signal for determining whether a suitable reference signal has been recovered, conditions for special processing to record the historical compensation required (and preferably also the ambient conditions, such as temperature), in order to predict the required compensation/control signals required in the event open loop operation is necessary because of the absence of a suitable reference signal.

According to another aspect of the invention there is provided a synchronization system comprising a reference signal recovery unit for recovering a reference signal, said reference signal having phase and frequency signal characteristics, said recovery unit including a slip buffer; a controllable signal source for producing an output signal having phase and frequency signal characteristics; a signal detector connected to an output of said recovery unit and an output of said controllable signal source, said signal detector detects signal differences in one of said signal characteristics between said output signals, and produces a difference signal indicative of said differences; and a controller connected to receive said difference signal as an input and to receive an indication from the recovery unit when a slip occurs and for producing a control signal for controlling said controllable signal source in order to reduce slipping. According to one such embodiment, the controllable signal source comprises a controllable oscillator and wherein said signal detector comprises a phase detector for producing a phase difference signal indicative of the phase difference between said oscillator output and said reference signal and wherein said controller further comprises means for processing said difference signal in order to estimate the long term phase error in order to determine whether the system is approaching a slip.

It should be noted that the invention described herein includes three broad advances over the state of the art.

A first broad aspect includes a sync system with multiple modes of operation.

A second broad aspect includes a sync system which uses the status of the slip buffer to control the sync output in such a manner as to reduce slipping.

A third broad aspect includes a sync system which makes periodic aging estimations based on its operating conditions which are stored for subsequent use during initialization and during certain fault conditions.

Each aspect is separately useful and advantageous, and various combinations can be used to improve overall performance.

We will now describe the preferred embodiment of each aspect with respect to a single system which advantageously combines all 3 aspects into a single system.

BRIEF DESCRIPTION OF THE DRAWINGS

The present invention, together with further objects and advantages thereof will be further understood from the following description of example embodiments with reference to the drawings in which:

FIG. 14 is a table illustrating some to the threshold values for various filter states for the filters of FIGS. 11–13 according to a preferred embodiment of the invention.

DETAILED DESCRIPTION OF THE PREFERRED EMBODIMENT

Figure 1:
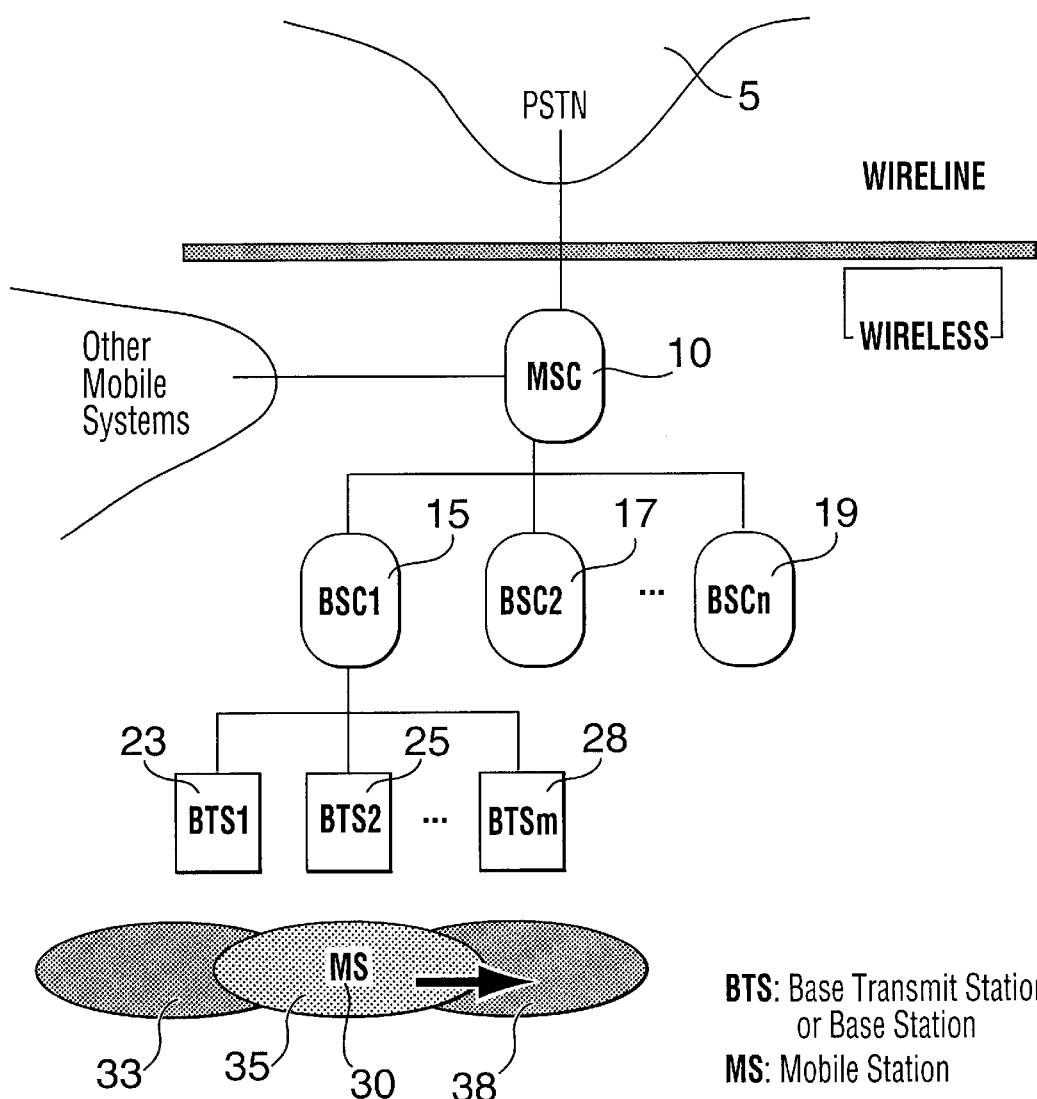
FIG. 1 illustrates a wireless system architecture which advantageously makes use of the invention.

For ease of reference, we will first list some of the terms, acronyms and variables used:
FPADLL: Frequency-Phase Adaptive Double Locked-Loop
Sync: Synchronization
BSS: Base Station Systems
MS: Mobile Station
BSC: Base Station Controller
BTS: Base Transceiver Station
OCXO: Oven-Controlled Oscillator
OCVCXO: Oven-Controlled Voltage-Controlled Oscillator
PLL: Phase Locked-Loop
FLL: Frequency Locked-Loop
Pre_FLL Initialization:
  A Sync Controller operation state for DAC_in to quickly converge to DAC_in_aging.
Post_FLL Initialization:
  A Sync Controller operation state for DAC_in to finely tune to DAC_in_aging.
MSC: Mobile Switch Center
SMCF: Small Main Control Functions module
SPCMI: Small PCM Interface module
Clock1: 2.048 MHz clock, one of the Sync outputs
Clock2: 4.096 MHz clock, one of the Sync outputs
Sync Pulse1: 8 KHz Pulse, one of the Sync outputs
Sync Pulse2: 8 KHz Pulse, one of the Sync outputs
FPGA: Field Programmable Gate Array
Fpc: A frequency used by the phase detector for phase comparison
Tpr: A half of the maximum phase range which the phase detector may detect; (Tpr=1/Fpc)
Fs: The sampling frequency of the phase signal from the phase detector
Ts: The sampling period of the phase signal; Ts=1/Fs
Nphase: Number of the bits used to represent the phase signal samples
Fup-down: The frequency of a clock used to the up-down counter of the phase detector
DAC_in: A digital signal, i.e., the input of the OCVCXO; also the output of the Sync Controller
DAC: Digital to Analog Converter
DAC_in_aging:
  A DAC_in which is obtained after the aging processing and represent the estimation of the specification DAC_in at the time
DAC_in_aging_close:
  A rough estimation of the DAC_in aging;
  The DAC_in at the moment when the Sync controller exits from the Pre_FLL Initialization state
Npf: Number of taps of the phase filter used in Pre_FLL Initialization state
Tpf: Period of time over which the phase filter operates; Tpf=Tpf Ts
Nff: Number of taps of the frequency filter used in Pre_FLL Initialization state
Tff: Period of time over which the frequency filter operates; Tff=Tff Ts
Ndac_pre: A DAC_in variation threshold value for Sync Controller to exit Pre_FLL Initialization state
Npre: The number of the frequency filter operation periods during Pre_FLL Initialization
Ndac_post: A DAC_in variation threshold value for Sync Controller to exit Post_FLL Initialization state
Npost: The number of the frequency filter operation periods during Post_FLL Initialization
Φmax_post: A threshold of maximum phase error for the Sync Controller to exit Post_FLL Initialization
Fmax_post: A threshold of maximum frequency error for Sync Controller to exit Post_FLL Initialization
Ndac_nor: A DAC_in variation threshold value for Sync Controller to update DAC_in_aging during FPADLL normal operation
Nnor: The number of the frequency filter operation periods during FPADLL normal operation
Φmax_nor: A threshold of maximum phase error for Sync Controller to update DAC_in_aging during FPADLL normal operation
Fmax_nor: A threshold of maximum frequency error for Sync to update DAC_in_aging during FPADLL normal operation
DAC_in_holdover:
  A DAC_in estimated for Sync Controller to use during Sync holdover
Lost_Reference_Fault_Condition:
  The condition used to decide if the reference clock is lost
Bad_Reference_Fault_Condition:
  The condition used to decide if there is a bad reference clock
fer: A frequency error estimated by the multistate frequency filter
Φer: A phase error estimated by the multistate phase filter
Th_fN: A set of thresholds on the frequency error for multistate filter operation
State_Max: The maximum state of the multistate filters
fLT: A long term frequency error estimation
ΦLT: A long term phase error estimation
Th_ΦLT1: The threshold on phase for Sync to turn in PLL1
Th_ΦLT2: The threshold on phase for Sync to turn in PLL2
Th_ΦLT3: The threshold on phase for Sync to turn in PLL3
Th_fLT: The threshold on frequency for Sync to stay in FLL
Th_ΦLT0: The threshold on phase for Sync to get back to FLL from the PLL
DAC_in_Delta:
  The DAC_in variation over one updating period during the normal operation
DAC_in_Max: Maximum DAC_in OCVCXO can tune
DAC_in_Min: Minimum DAC_in OCVCXO can tune
DAC_in_Delta_phase: The DAC_in_Delta during PLL mode
DAC_in_Delta_freq: The DAC_in_Delta during FLL mode A preferred embodiment of the invention will be discussed with reference to a basic transceiver station (BTS) in the wireless system architecture as illustrated in FIG. 1, wherein a mobile switch centre (MSC) 10 is up-connected to the PSTN network 5 and down-connected to multiple base station controllers (BSC) 15, 17, 19. Each BSC controls multiple BTS 23, 25, 28, and each BTS covers a radio coverage area, called a cell 33, 35 and 38 respectively, to support the wireless communication with wireless terminals, for example, mobile station 30.

Synchronisation, while being generally important, is particularly important for hand off, for example, when mobile terminal 30 moves from cell 35 to cell 38. In this case, it is important that BTS 25 is in sync with BTS 28. Note that BTS 28 could be controlled by another BSC, for example BSC 17. In which case each of BSC 15, BTS 25, BSC 17 and BTS 28 must be suitably synchronised for a successful handover.

The physical links between the PSTN and MSC, between MSC and BSCs, and between BSCs and BTSs, could belong to either of the mobile communication operator, or the local PSTN operator. The links are typically $DS1_{(T1)}$ E1, ISDN, or HDSL. For convenience, we will assume that T1 links are used to carry the data communications between a BSC and BTSs, although other types of links can be used.

We will discuss the preferred embodiments with respect to their implementation in a BTS, although it should be appreciated that they can be implemented in other network elements, for example BSCs and MSCs.

Figure 2:
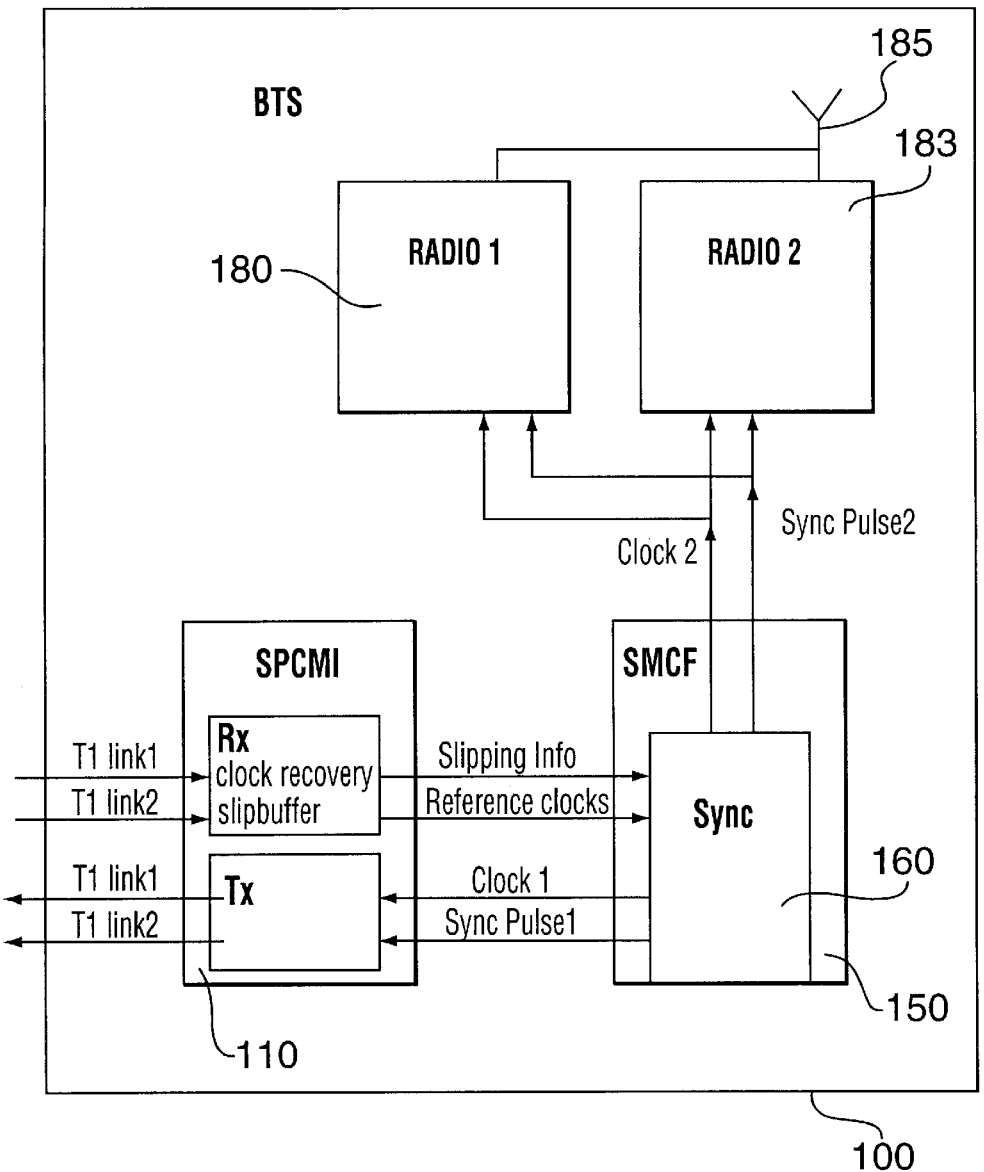
FIG. 2 is a block diagram of the base station according to a preferred embodiment of the invention.

We will now describe FIG. 2, which is a block diagram of a BTS according to a preferred embodiment of the invention. For clarity, only the components used for synchronisation are shown. For synchronisation purposes, the BTS is shown to include a SPCMI (Small PCM Interface or T1/E1) module 110, a SMCF (small main common functions) module 150, which in this embodiment includes the Sync module 160, two radios 180, 183 (of course, one or more could be used) and two T1 links (once again, one or more could be used). The SMCF is the base station main control function module. The SPCMI acts as the network clock reference recovery interface. In the receive (Rx) direction, the SPCMI receives T1 link data from the backplane lines, recovers the T1 clocks, delivers the data to the SMCF, monitors the phase slipping using a conventional T1 transceiver device, and sends the recovered clocks and the slipping information to the Sync module. In the transmit (tx) direction, the SPCMI receives data, Clock1, and Sync Pulse1 from the Sync module and transmits the T1 link data to the backplane lines (for example a BSC).

The Sync module forms part of the SMCF. Besides the Sync module function, the SMCF performs data link switching, radio link power control, OA&M and other base station common functions.

The Sync module includes a clock selector (not shown) for selecting one of the clocks received from the SPCMI as its reference clock. The Sync module then generates and outputs two clock signals, Clock1 and Clock2, and two Sync pulses, Sync Pulse1 and Sync Pulse2. Clock1, which is a 2.048 MHz signal, and Sync Pulse1, which is an 8 KHz signal, are sent to the SPCMI. Clock2, which is a 4.096 MHz signal, and Sync Pulse2, which is an 8 KHz signal, are sent to all the radios in the base station.

Based on Clock2 and Sync Pulse2 received from the Sync module, each of the radios generates its radio frequencies and timing information, and communicates synchronously with wireless terminal over-the-air by transmitting and receiving data via the antenna 185. The terminal generates its radio frequencies and timing signals based on the synchronisation information received from the base station. Thus, if the Sync module output in the base station does not meet the frequency stability and accuracy requirement, the mobile will suffer high call block rates, for example, due to handover failures when a mobile terminal moves from one base station's cell coverage to another. Also the over-the-air communication will suffer high bit error rates due to radio interference caused by the poor synchronisation. This results in poor voice or data communication link quality.

Figure 3:
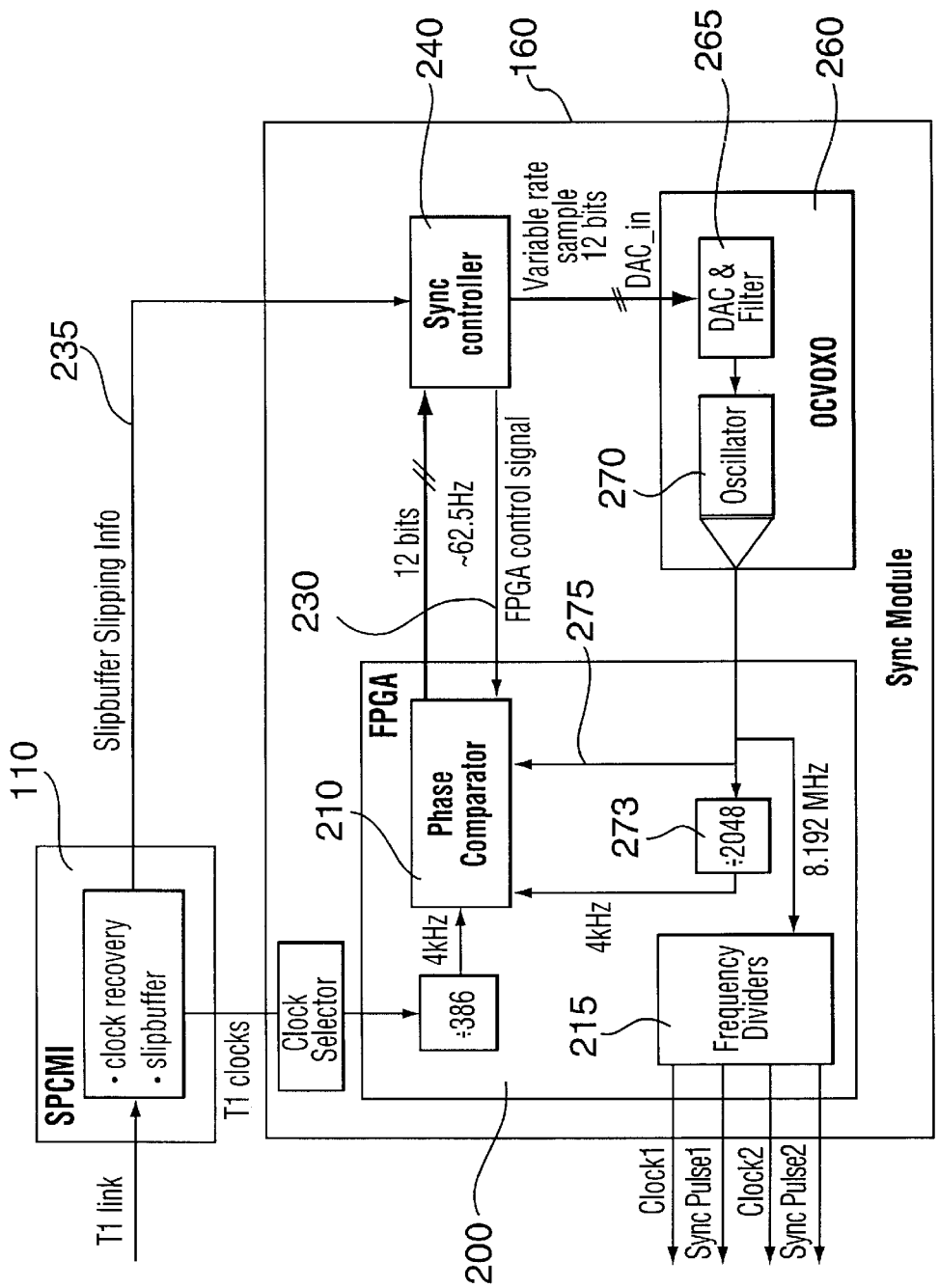
FIG. 3 is a block diagram of the synchronisation (Sync) module according to a preferred embodiment of the invention.

The functional block diagram of the Sync system according to a preferred embodiment of the invention is illustrated in FIG. 3. This system comprises a feedback loop of:
1. a phase detector 200 (which includes an input clock selector);
2. a Sync controller 240, and
3. an OCVCXO oscillator module 260.

Also shown is the SPCMI (Small PCM Interface) 110, which acts as the network T1 interface, and has three functions to support the synchronisation operation.

In this embodiment, the phase detector 200 is implemented in logic circuits on a field programmable gate array (FPGA).

Functionally, the phase detector detects the phase difference between the input reference T1 clock signal and the OCVCXO output clock signal (8.192 Mhz). The input reference T1 clock (1.544 MHz) is recovered and delivered to the Sync module 160 by the network interface module 110.

These two clock signals are each divided by FPGA divider logic to a common frequency level of $F_{PC}$ (wherein the subscript pc stands for phase comparison) and then fed into a phase comparator 210. The phase difference range which is detected is $+/-T_{PR}$ micro-seconds, where $T_{PR}=1/F_{PC}$ (wherein the subscript PR stands for Phase Range).

The phase difference signals are then up-down counted by FPGA up-down counter (not shown, but which forms part of the phase comparator 210 in this embodiment) at a clock of $F_{up-down}$ Mhz which is preferably the oscillator output frequency, which is received via link 275. The output of this counter is latched every $T_S$ ms, or latched at a rate of $F_s$, where $F_S=1/T_S$ (wherein the subscript S stands for sampling). The accuracy of the latched phase difference signal is decided by the frequency $F_{up-down}$. The output of the phase detector is the phase difference signal $\phi(n)$, which is sent in $N_{phase}$ bit samples.

The $F_{pc}$ and $F_{up-down}$ are selected based on two considerations. First the phase detector should provide sufficiently accurate phase measurements over a sufficiently large phase range. Secondly, the $F_{up-down}$ should be easily divided into the multiple frequencies required by other BTS modules. From $F_{pc}$ (or Tpr) and $F_{up-down}$, $N_{phase}$ is chosen such that 2 raised to the power of $N_{phase}$ is equal to 2Tpr $F_{up-down}$, or $2/(F_{pc} F_{up-down})$.

Ts or Fs is selected mainly for the Sync Controller to provide sufficient accuracy of phase error and frequency error processing and estimation over sufficient frequency range.

$T_s$ is selected to provide sufficiently accurate phase measurements without excessive processing requirements.

In this embodiment $F_{pc}=4$ KHz, $T_{PR}=250$ micro-seconds, $F_{up-down}=8.192_{MHZ}$, $T_s=16$ ms, and $F_s=62.5$ Hz, and $N_{phase}=12$ bits. Thus, the total number of levels to represent the said phase difference is 4096. The step interval of the phase detector output is 122 ns.

The Sync controller 240 comprises a microprocessor and associated memory (not shown). The associated memory includes program instructions for carrying out the methods described herein, and working memory. Note that a dedicated Sync controller is not necessary, as it functions can be carried out by the SMCF controller (not shown). A DSP processor could be used to implement the Sync Controller instead of a micro-processor. Similarly, an ASIC or discrete logic circuits could be used to replace the FPGA.

The primary Sync control functions carried out by the controller are phase and frequency signal processing and Frequency—Phase Adaptive Double Lock Loop (FPADLL) operations, as described hereafter.

The controller 240 reads the phase difference output samples from the phase comparator 210 of the phase detector 200, processes the digital phase signals and produces an output signal called DAC_in which will be fed to OCVCXO 260 for its output frequency adjustment. The controller also sends a control signal to the phase comparator 210. The output from the OCVCXO oscillator 270 is sent to the phase detector 200 where it is divided to the common comparison frequency by divider 273, used as the $F_{up\text{-}down}$ signal by the comparator 210, and is divided into the four output signals Clock 1, Clock 2, Sync Pulse 1 and Sync Pulse 2 by divider 215.

Other Sync control functions preferably include:
1. adjusting the signal processing algorithms to adapt to measured changes in the T1 reference clock;
2. determining whether the T1 reference input satisfies normal operating parameters;
3. properly responding to a T1 reference input which fails to satisfy normal operating parameters;
4. controlling said clock selector for switching between T1 reference inputs as specified through control messages from the BSC;
5. accelerating the warm-up process;
6. processing and predicting the OCVCXO aging affect and making appropriate adjustments;
7. adjusts the operation of the feedback loop in response to slipping.

These functions will be described in more detail below with reference to the Sync controller and FPADLL processing and operation procedures.

The OCVCXO module 260 as shown in FIG. 3, comprises a digital-to-analog converter (DAC) and analog low pass filter 265 as well as an OCVCXO 270. In this embodiment, the OCVCXO operates within a predefined operating temperature range, which is automatically maintained by the OCVCXO. The OCVCXO could be replaced with a TCVCXO or even a VCXO for applications where temperature stability requirements are relaxed, such as for indoor deployment.

The OCVCXO module 260 receives a digital input signal, DAC_in, from the controller 240, converts the DAC_in signal to an analog voltage signal and stabilizes it, and then adjusts the oscillator output frequency accordingly based on the filtered voltage.

The digital DAC_in signal is a control signal sent in 12 bit samples, wherein there are a total 4096 OCVCXO controlling steps. The frequency step size depends upon the type of OCVCXO used, but is preferably around 1 ppb.

With respect to the extracted clock reference signal, the SPCMI 110 supports the Sync module in following three aspects:
1. SPCMI recovers the T1 clock (1.544 MHz) from the T1 link in a conventional manner. The recovered T1 clock signals are then sent to the Phase Detector wherein one is selected as the Sync module reference signal. Alternatively, the SPCMI can select and forward only once T1 clock signal.
2. SPCMI has a controlled slip buffer with the size of two frames (125 micro seconds per frame). The slip buffer is used to absorb the differences in frequency and phase between the T1 data stream and a stable local clock (i.e., clock 1) which is one of the Sync module outputs. If the SPCMI recovered T1 clock advances with respect to the local clock by about 125 micro seconds, the slip buffer will give up one frame and there is a positive frame slip. On the other hand, if the local clock advances the T1 clock by a frame time, the slip buffer will repeat one frame and there is a negative slip. Clearly, the slipping impacts the link quality. Note that this is called a controlled slip buffer because it only allows slips to occur in a controlled fashion, by repeating or omitting a complete frame.
3. The SPCMI detects the slip buffer slipping information (for example whether a positive slip or negative slip has occurred) in a conventional manner. Through software link 235, the slipping information is delivered to the Sync controller within a few $T_s$ periods of time. Advantageously, according to one aspect of the invention, by providing this slipping information to the sync controller, the slip buffer is not only used to compensate for slips which occur, but also is used by the controller for synchronization purposes, as described in more detail below.

Figure 4:
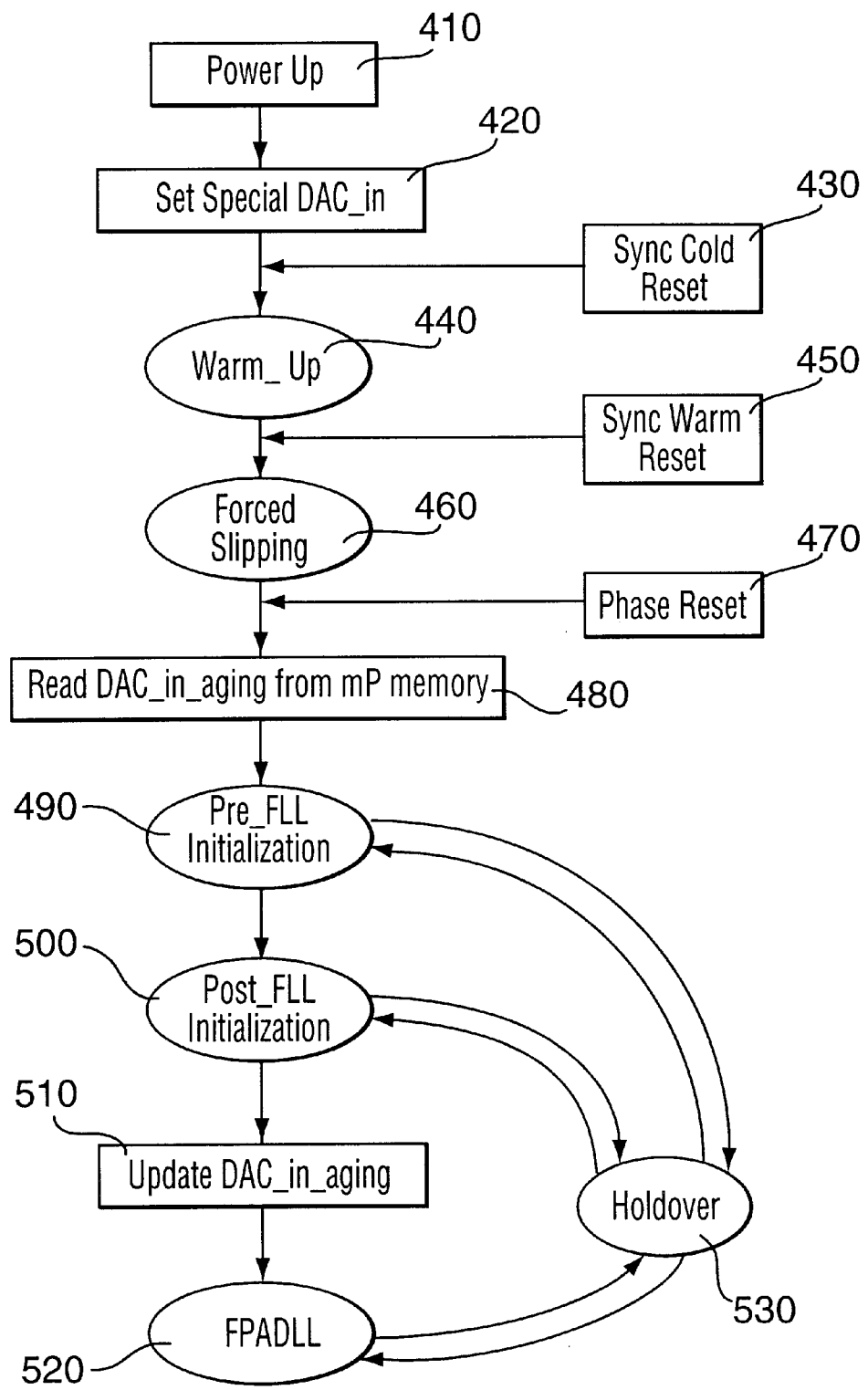
FIG. 4 is a flowchart of the Sync module operation procedure steps carried out by the Sync controller according to a preferred embodiment of the invention.

Having now described the basic structure of a preferred embodiment of the sync system, we will now describe the preferred Sync Module Operation Procedures. The operation procedure steps carried out by the Sync controller (which is controlled by software instructions stored in the associated memory and executed by the micro processor) according to a preferred embodiment of the invention are shown in FIG. 4. In the figure, an oval represents a state/procedure in which there could be multiple operations. A square stands for an operation where either a parameter could be read from outside of the Sync controller; or a parameter is output or updated.

The Sync controller operation procedures consist of 6 states (procedures) and 7 special operations. The states are:
1. Warm_up 440;
2. Forced_slipping 460;
3. Pre_FLL initialization 490;
4. Post_FLL initialization 500;
5. FPADLL 520;
6. Holdover 530.

The special operations are:
1. Power up 410;
2. Set Special DAC_in value 420;
3. Sync Cold Reset 430;
4. Sync Warm reset 450;
5. Phase Reset 470;
6. Read in DAC_in_aging for micro processor 480; and
7. Update DAC_in_aging 510;

Whenever the system is initially powered up 410 (for example, during installation or after maintenance) an initial DAC value is set 420. This value is the most recently stored DAC_in_aging value (which is initially set during manufacture and/or testing of the BTS). A sync Cold reset step 430 is performed after power up to reset the sync system prior to the warm up state. This cold reset step can also occur whenever the sync system otherwise needs to be reset prior to a warm_up state.

Warm_Up

After power up 410, the OCVCXO requires a warm-up period to reach stable performance. This warm-up period allows the OCVCXO's internal oven control to reach its operating temperature. The Warm_up state 440 controls the duration of the warm_up period before the system advances to the next state, based on the results of temperature measurements made by a temperature sensor (not shown). This is particularly important for outdoor base stations which can be exposed to a wide range of temperatures. Note that for some maintenance or operating conditions, a warm sync reset 430 can occur, which assumes that the OCVCXO is within its operating temperature range.

Initially, after power up or a reset, there are signal characteristic differences—(e.g., phase and frequency offsets) between the T1 reference input clock and the Sync module output clock. To align the frequency of the Sync module output and the T1 reference clock, a process of initialization is implemented. One purpose of this initialization step is to have the signal characteristics between the two clocks sufficiently close together that normal, iterative feedback control can be used.

In the preferred embodiment, several sub-initialization steps are used as follows.

Forced_Slipping

In the preferred embodiment, the sync system estimates the actual phase difference error between the phase of the reference signal and the phase of oscillator output signal. The preferred embodiment also uses the state of the slip buffer as a boundary condition of the system's estimate of the actual phase difference error. Thus a process of Forced_Slipping is used during initialization. Preferably this can be handled through digital logic by directly resetting the slip buffer.

Alternatively, if no direct control of the slip buffer is available, the system can force a slip by adjusting the phase. A fast speed is selected to minimise the time required to complete this phase alignment process by selecting a DAC_in value which has the maximum allowed difference from the most recently stored DAC_in_aging value.

However, in order to avoid overshooting, and in order to compensate for delays (for example in receiving the slipping info for link 235), the phase and phase changing rate are monitored and measured during Forced_Slipping. To minimize the phase error between the Sync module phase comparator and the T1 transceiver slip buffer, the phase adjustment speed of the forced slipping is reduced when the phase error indicates the buffer is approaching a slip.

Whenever the SPCMI detects a slip in the slip buffer, the SPCMI sends a slip message to the Sync Controller which will in turn order the Phase Detector to reset the phase via control signal link 230.

Pre_FLL Initialization

Figure 5:
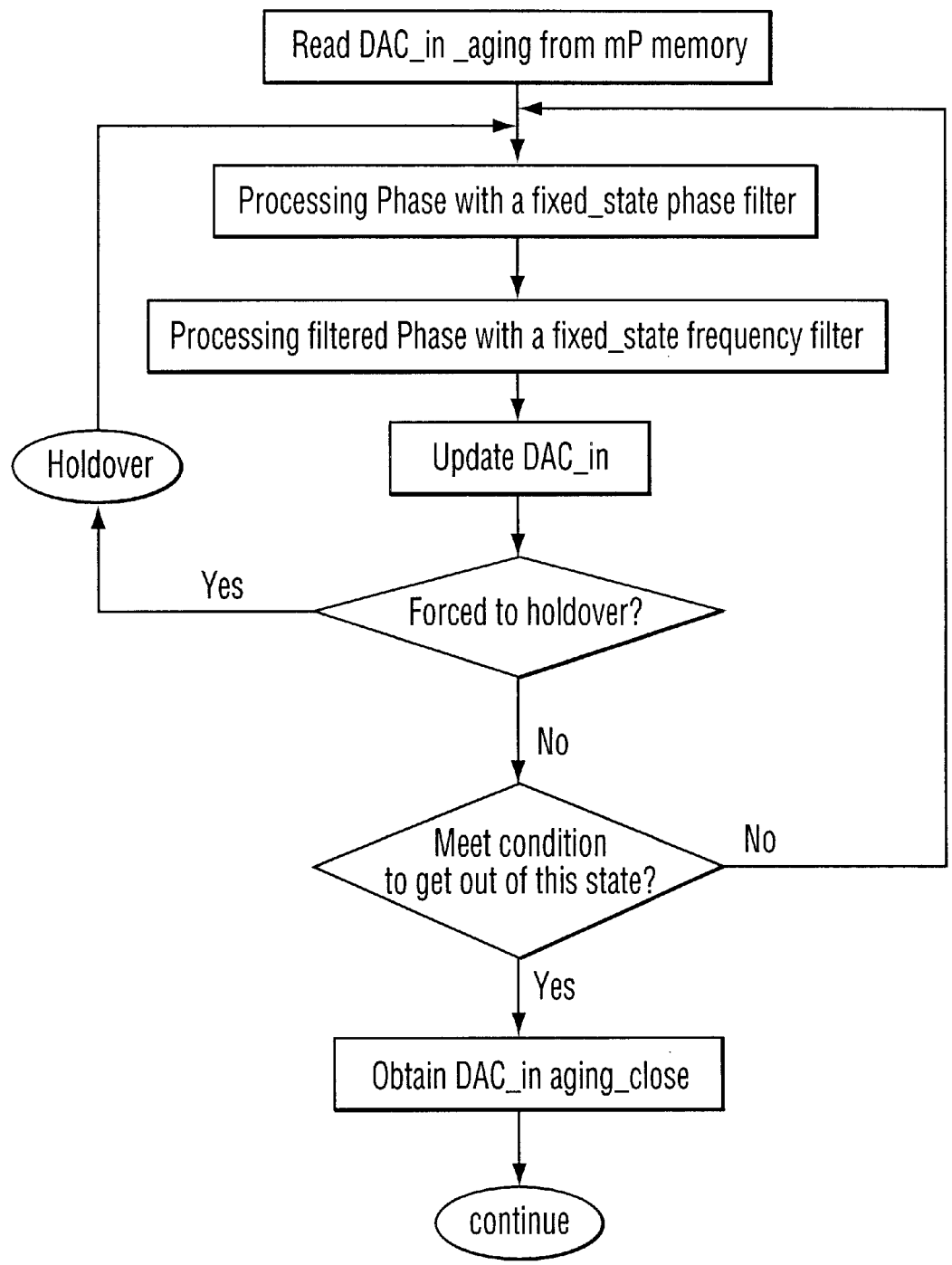
FIG. 5 is a flowchart illustrating the Pre_FLL initialisation steps of the Pre_FLL initialisation procedure of FIG. 4.

Pre_FLL_Initialization is used to operate the feedback loop in a FLL mode to rapidly adjust the OCVCXO frequency to the network clock frequency at a rate of many ppb per second. According to this embodiment, the system stores an initial value for use in this process, which is labelled as DAC_in_aging. This value is updated at regular intervals during normal operation. During initialization, this state uses this value as a starting point, and follows the procedure steps illustrated in FIG. 5 in order to obtain a value (DAC_in_aging_close) to be used in the next stage. As soon as the FLL reaches a 'near' stable value, this initialization process completes.

As shown in the figure, special phase and frequency fixed_state filters are used to control a frequency locked loop during this stage in order to quickly approach a frequency difference sufficiently small to proceed to the next stage, as defined by the conditions set out below.

In this embodiment, the phase filter operates as an Npf tap digital lowpass filter which is implemented in an accumulator over a period of Tpf seconds (wherein the subscript pf stands for phase filter). The input of the phase filter is the phase samples (i.e., the phase difference signal) from the phase detector, while the output of the phase filter is the estimation of the phase error and is used as the input of the frequency filter. The phase filter length, Tpf or Npf (Npf=Tpf/Ts), affects the speed of Sync DAC_in_aging convergence. In this embodiment, Tpf=0.512 seconds, and Npf=32.

The frequency filter is a Nff tap FIR digital lowpass filter with special coefficients as 1, −1, or 0 for easy implementation (wherein the subscript ff stands for frequency filter). The input of the frequency filter is the phase filter output, while the output of the filter is the estimation of the frequency error. The controller calculates a new DAC_in value in order to compensate for this frequency error. Thus, the accuracy of this estimate of the frequency error determines the rate of convergence to the final DAC_in_aging_close value. The frequency filter length, Nff, or Tff (Tff=Nff Ts) also affects the speed of Sync DAC_in_aging convergence process. In this embodiment, Tff=2.048 seconds, Nff=4, and the filter coefficients are [1, 0, 0, −1].

To exit this state and enter the Post_FLL_Initialization state, the following conditions shall be met. The conditions are defined in terms of:

the absolute DAC_in variation in the recent filter periods;

the DAC_in variation directions;

For example, the Sync Controller will exit from the Pre_FLL Initialization (in which case the DAC_in_aging_close will be the final DAC_in value) as long as the following conditions are met:

the absolute DAC_in variation should be smaller than Ndac_pre during the past Npre frequency filter periods (wherein the subscript pre stands for Pre_FLL Initialization);

there is no trend in the direction of the DAC_in variation over the same Npre frequency filter periods.

In this embodiment, Ndac_pre=5, and Npre=20.

As shown in the figure, this procedure can be interrupted if the T1 reference clock is unstable, or if the conditions to enter the holdover state are otherwise satisfied as described. In which case, a message will tell the Sync Controller to go into Holdover state (wherein processing for the best DAC_in_aging_close processing is suspended). The Sync Controller will revert to the Pre_FLL_Initialization operation with the updated DAC_in from the Holdover process when a suitable T1 reference clock is recovered. For details of Holdover operation, see the section of Holdover.

Post_FLL Initialization

The Post_FLL_Initialization is similar to the Pre_FLL_Initialization except that it begins with the FLL value from the "Pre" state, and requires that the estimated FLL frequency be more accurate (thus requiring longer filter time constants). This accuracy is verified by ensuring that the long term drift between the OCVCXO frequency and the PSTN frequency is bounded by a predefined value. As soon as the FLL reaches a 'very near' stable value, as defined by the conditions set out below, this initialization process is complete.

Figure 6:
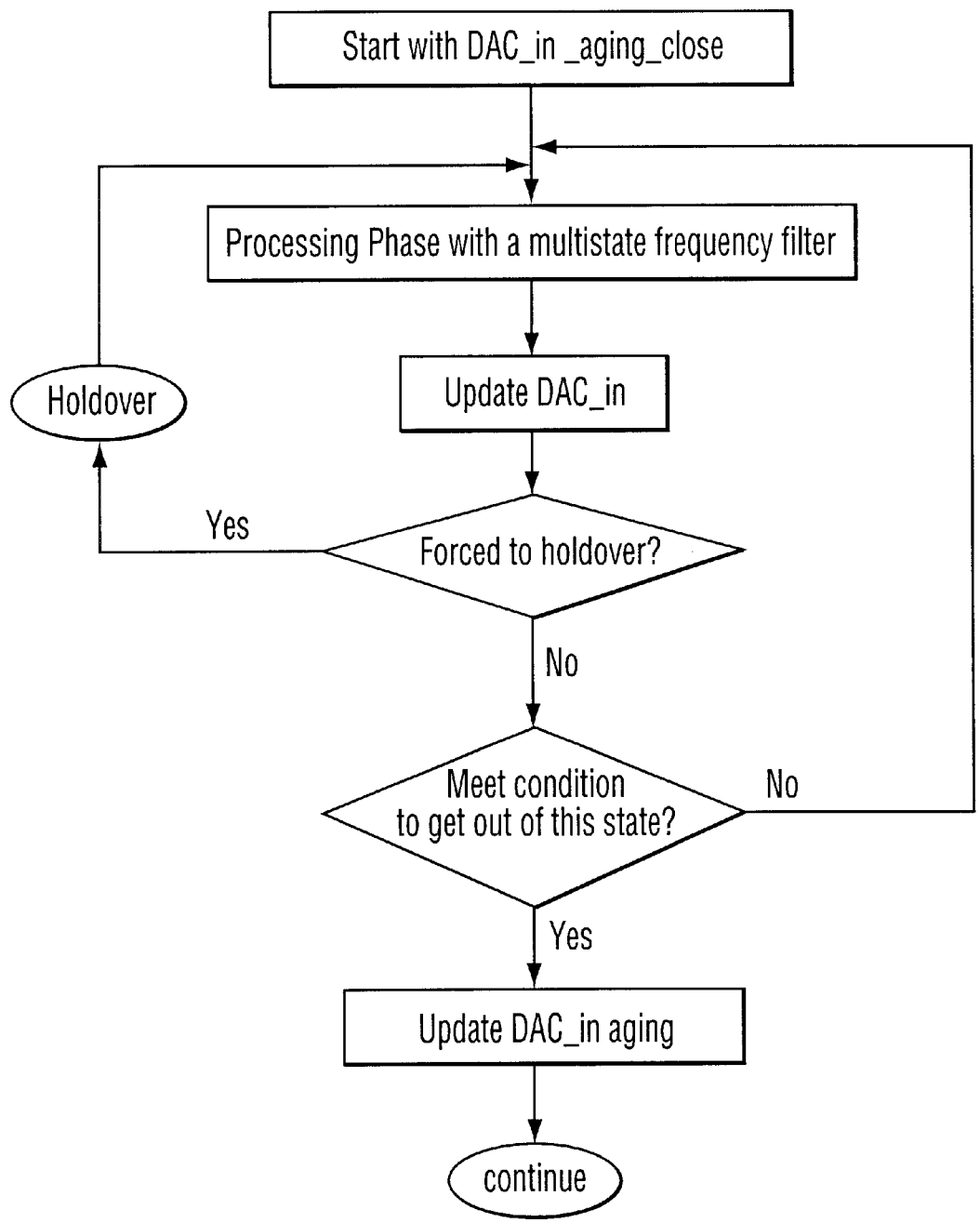
FIG. 6 is a flowchart illustrating the Post_FLL initialisation steps of the Post_FLL initialisation procedure of FIG. 4.

The procedure is given in FIG. 6.

A special multistate filter is used to control a frequency locked loop for searching an accurate best DAC_in. The length of the filter is designed to dynamically change for a linear convergence. The structure of the filter is described below.

To get out of Post_FLL_Initialization state and go into FPADLL state, another set of multiple conditions shall be met. The conditions are defined in terms of:
- the absolute DAC_in variation in the recent filter periods;
- the DAC_in variation directions;
- the operation state of the multistate filter;
- the phase error estimation;
- the frequency error estimation;

For example, the DAC_in_aging will be obtained as final DAC_in and will be stored in flash as long as the following conditions are met:
- the absolute DAC_in variation should be smaller than Ndac_post during the past Npost frequency filter (wherein the subscript post stands for Post_FLL Initialization);
- the DAC_in variation should change its direction at more than two times over the same Npost frequency filter periods;
- the multistate frequency filter should keep its in its highest state during Npost frequency filter periods;
- the maximum absolute phase error estimation should be smaller than Φmax_post during Npost frequency filter periods;
- the maximum absolute frequency error estimation should be smaller than Fmax_post during Npost frequency filter periods;

In this embodiment, Nda_post=2, Npost=10,Φmax_post= 3.7 micro seconds, and Fmax_post=5 ppb.

Preferably, once these exit conditions are satisfied, the system updates its DAC_in_aging records by storing the current DAC_in value as the most recently calculated DAC_in_aging value.

The state transition for Holdover is similar to that of the Pre_FLL_Initialization state.

PADLL Operation Procedures

After the best aging DAC_in, i.e., DAC_in_aging, is obtained, the Sync Controller will turn into frequency-phase adaptive double locked loop state, or FPADLL state, for its normal operation.

During FPADLL, the Sync system feedback loop controls the oscillator output to maintain both the frequency and phase characteristics of said output within boundary conditions by switching between multiple FLL and PLL modes.

Figure 7:
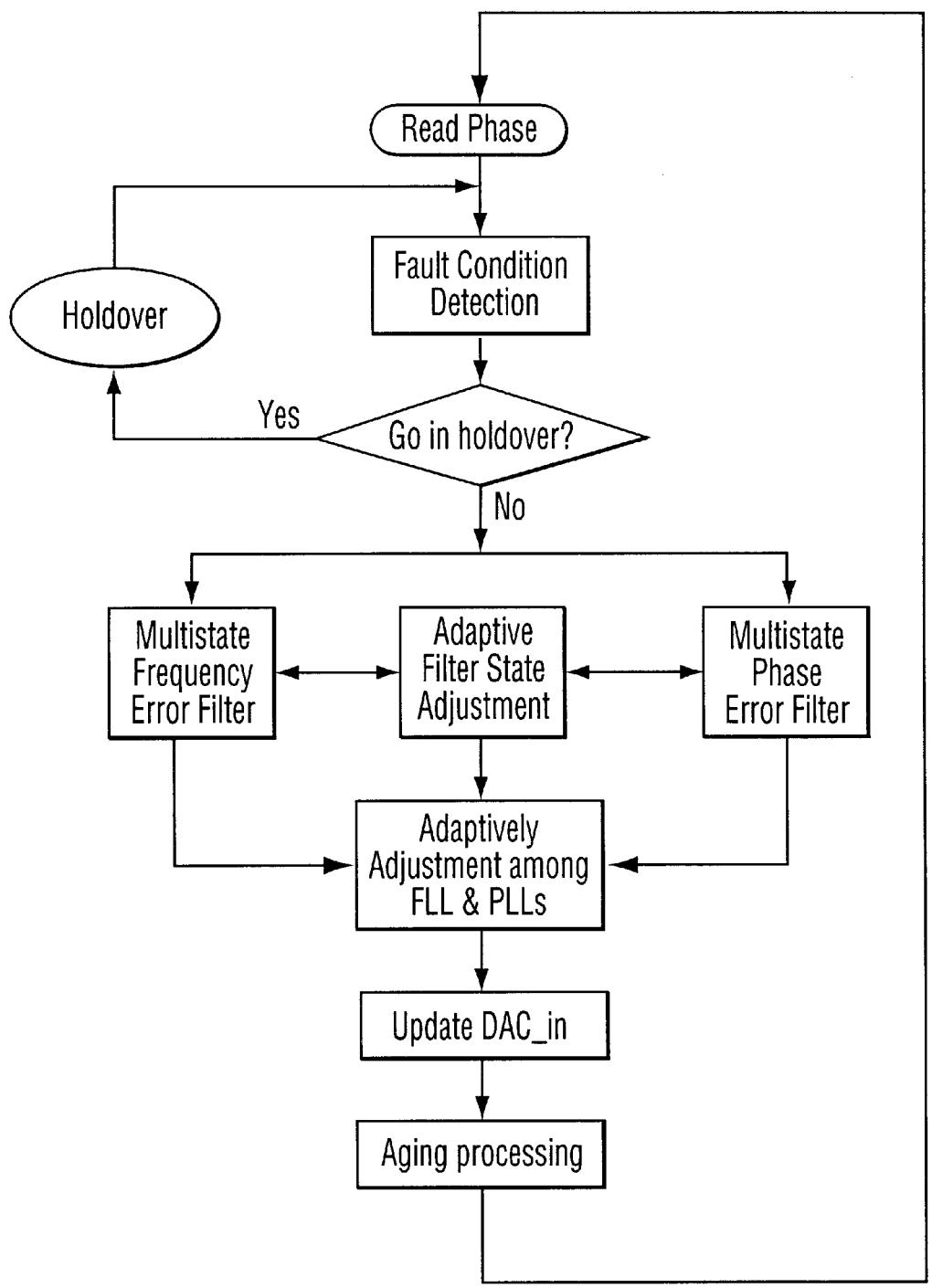
FIG. 7 illustrates the FPADLL procedure steps of the FPADLL procedure of FIG. 4.

The details of FPADLL operation are shown in FIG. 7, which comprises three parts: Fault condition detection for Holdover operation, Aging Processing, and FPADLL operations. We will therefore discuss the following steps, wherein step 1) is for the Holdover operation, steps 2–5) show the normal FPADLL operations, and step 6) is a trigger to determine whether aging processing is necessary:
1) Fault condition detection;
2) Multistate frequency error filter;
3) Multistate phase error filter;
4) Adaptive Filter State adjustment;
5) Adaptively adjust between FLL and PLL mode; and
6) Aging Processing.

These steps are described below.
1) Fault Condition Detection

There are two types of fault conditions, i.e., the lost reference condition and the bad reference condition.

The lost reference condition detection is implemented by monitoring the phase error variation rate, or the slope of the phase error curve. First, the phase error is processed by accumulating the phase signal over a certain period of time to filter out short time noise. Secondly, the history of a certain number of the accumulation results is stored. Then the phase variation rates are calculated based on the phase estimations. Finally, the lost reference fault conditions are detected according to the following:
IF (the phase variation is in the same direction)
AND IF all the phase variation rates meet the lost reference Threshold
THEN a lost reference fault condition is detected.

The lost reference threshold is defined according to a frequency offset which is greater than the expected Stratum-3 frequency errors (assuming a Stratum-3 T1 reference signal).

The bad reference condition detection is implemented by monitoring the phase error variation rate (the slope of the phase error curve) in the similar method as in the lost reference condition detection.

The bad reference threshold is defined according to a frequency offset which is known to exceed the normal operating bounds of the T1 reference source. Preferably the sync system with send an indication to the network element which produces the T1 reference signal of the bad reference condition detected.

Steps 2–5 represent the normal FPADLL operations, wherein the phase difference sample is processed, and then the mode of operation is determined based on the applicable boundary conditions. Note that specific boundary conditions are listed as thresholds by way of example. In brief, the phase difference samples are processed by the controller, which uses multistate frequency and phase error filters to produce phase and frequency error estimations.

2) Multistate Frequency Error Filter

Figure 11:
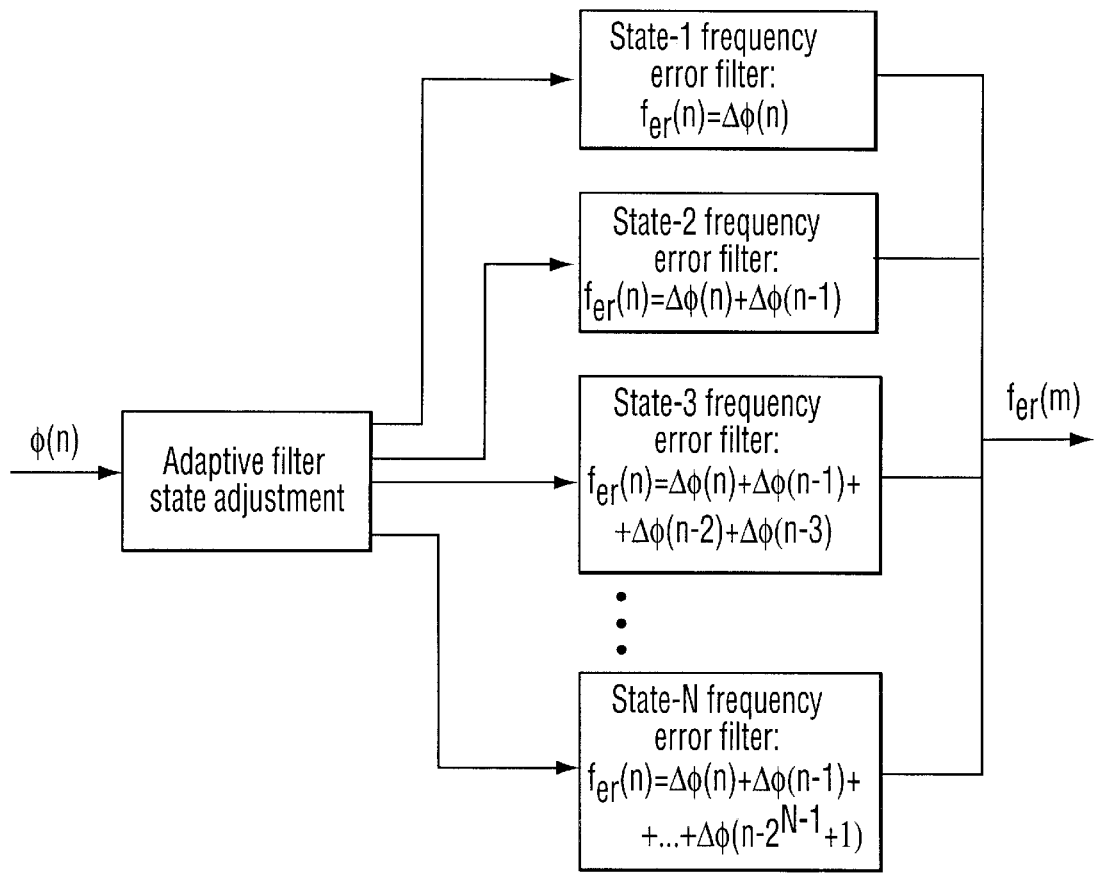
FIG. 11 is a block diagram of the multistate frequency error filter for the adaptive filter state adjustment according to a preferred embodiment of the invention.

The multistate frequency error filter is implemented in software run by the controller according to the architecture illustrated in FIG. 11.

The input to the multistate filter is the phase difference sample measured from Phase Detector. The output of the filter is the frequency error, which is an estimate of the frequency difference between the reference clock and the oscillator output. The phase input is a fixed rate signal and the rate of the output frequency error signal is variable, as the filters have different bandwidths depending on the state k. As can be seen by the equations shown for each filter, the lower the filter state number, the shorter the filter length and the wider its bandwidth. For each increase in state, the corresponding decrease in the filter bandwidth can be linear or non-linear. We have found a successful results by doubling the filter bandwidth for each reduction in state.

Note that the output sampling rate is not the same as the input sampling rate, as this depends on the state of the filter. FIG. 14 is a table which illustrates the desired filter length and the number of phase difference samples required for each output sample for each state k. Note that the sampling rate of the filter output is conveniently the same rate as the DAC_in updating rate.

The total number of the states of the multistate frequency filter is dependent upon the network clock performance and the Sync module specification. With the filter structure and sampling rate above, it is found that N as 10 is enough to be able to deal with the Stratum-3 clock.

3) Multistate Phase Error Filter

Figure 12:
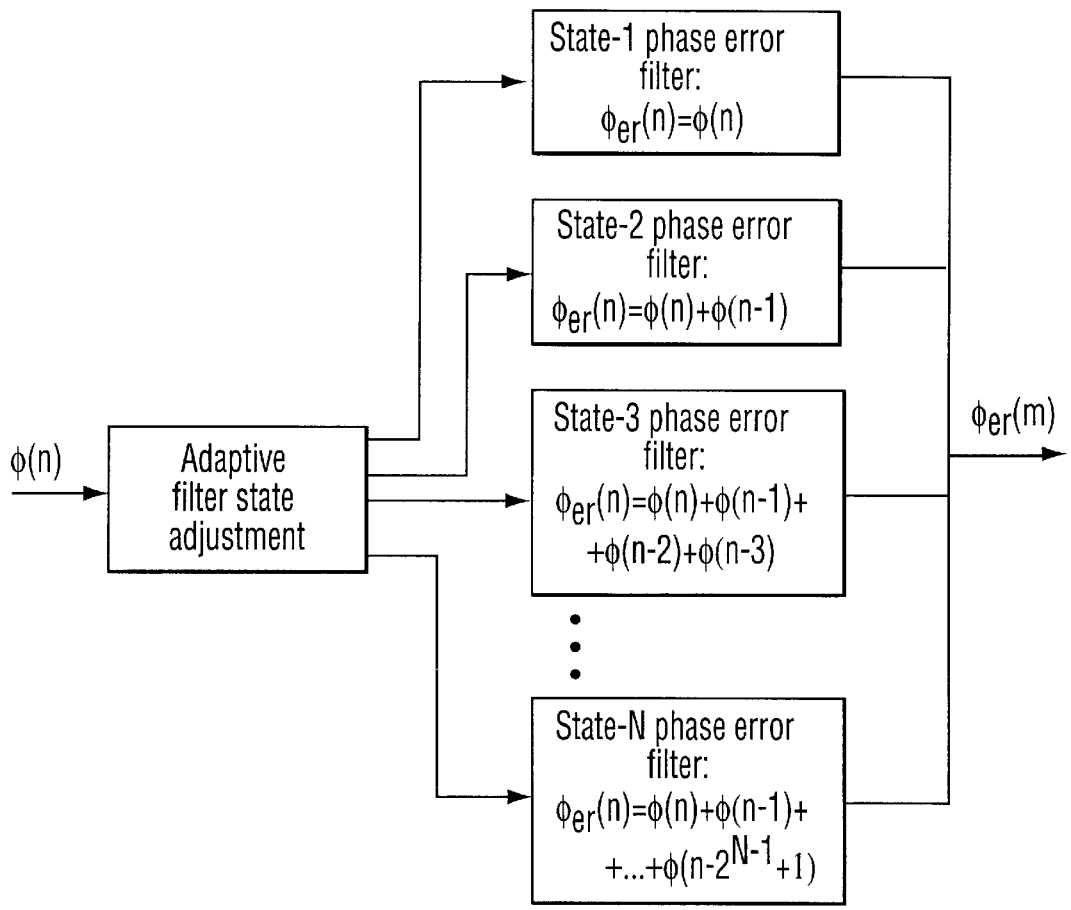
FIG. 12 is a block diagram of the multistate phase error filter for the adaptive filter state adjustment according to a preferred embodiment of the invention.
Figure 13:
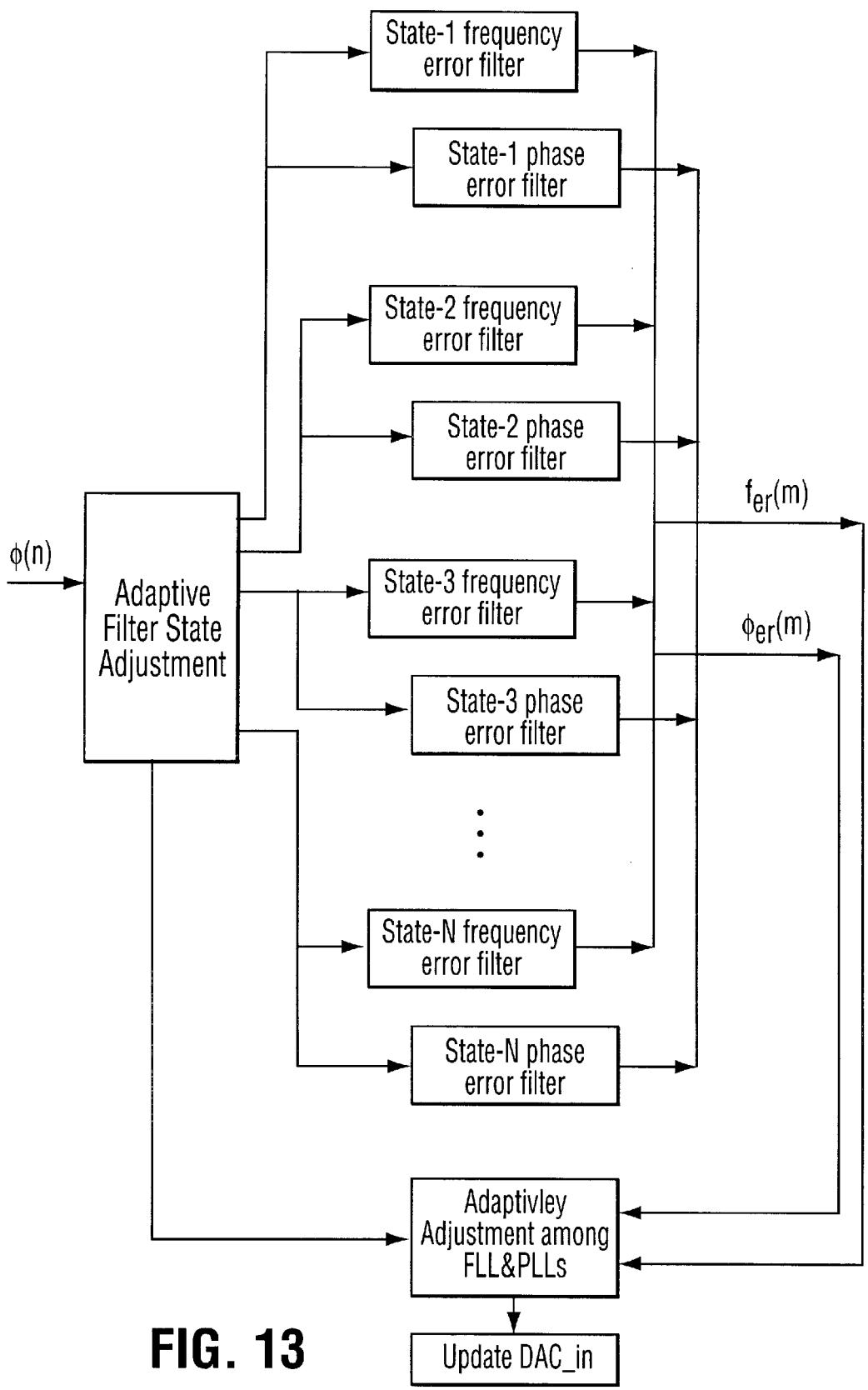
FIG. 13 is a block diagram of the Sync controller adaptive filter state adjustments illustrating the combination of FIGS. 11 and 12 in order to adaptively adjust between FLL and PLL mode according to a preferred embodiment of the invention.

The architecture of the multistate phase error filter is similar to the multistate frequency error filter, and given in FIG. 12.

Preferably the multistate phase error filter shares the same architecture, the sampling rate, specific filter bandwidth, state number, etc. as the multistate frequency error filter.

However, as shown, the specific state phase filters have different structures then the frequency filters.

The input to the multistate filter is the phase difference sample measured from Phase Detector. The output of the filter is the phase error, which is an estimate of the phase difference between the reference clock and the oscillator output. The input signal rate is the fixed phase difference sampling rate and the rate of the output phase error signal depends on the filter length as shown in FIG. 14 and therefore varies according to the state K.

The decision on the state adjustment of both the multistate frequency error filter will be described in the section of "Adaptive Filter State Adjustment".

4) Adaptive Filter State Adjustment

The state of the multistate frequency error filter or the multistate phase error filter is automatically adjusted. The state adjustment rate is the filter operation rate.

The decision on the state adjustment of both the multistate frequency error filter and the multistate phase error filter will be made based on the criteria of: the state of the multistate filters, the stability of the FLL and PLL modes, and the sign of $f_{er}(m)$, and the values of $f_{er}(m)$ and $\phi_{er}(m)$. (wherein the subscript er stands for error).

The auto-adjustment processing logic is:
IF ($|f_{er}(m)|$>=Th_fN AND k>1)
    Then k=k−1;
ELSEIF ($\phi_{er}(m)$>=Th_$\phi$N(1) AND k>1)
    Then k=k−1;
ELSEIF ((($f_{er}(m)*f_{er}(m-Ts))<0$ OR $f_{er}(m)=0$)
    AND ($|f_{er}(m)|$<Th_fN)
    AND ($\phi_{er}(m)$<Th_$\phi$N(1))
    AND (k<State_Max))
    Then k=k+1;
ELSE no change of state;
Wherein:

The Th_fN(1) is a set of the thresholds on the phase error defined in FIG. 14, which changes from state to state.

The Th_fN is a set of the thresholds on the frequency error defined also in FIG. 14.

The State_Max, i.e, N, is the maximum state number of the multistate filters.

Note that the term $f_{er}(m-Ts)$ is not the previous sample of $f_{er}(m)$ in the time base of $T_m$. It is an intermediate result just before the last addition of the phase variation accumulation. With the definition of the $f_{er}(m)=\Delta\phi(n)+ \ldots +\Delta\phi(n-2k+1)$, $f_{er}(m-Ts)=\{\Delta\phi(n)+ \ldots +\Delta\phi(n-2(k-1)+1)\}$, where "k" is the state number of the current state.

5) Adaptive Locked Loop Mode Adjustment

The outputs of the multistate frequency error filter and the multistate phase error filter are processed for long term phase error estimation $\phi_{LT}(m)$ and a special frequency error $f_{LT}(m)$ estimation, are used to adaptively control the locked loop mode adjustment and to control the DAC_in updating in either FLL, or one of PLL modes.

The long term phase error signal $\phi_{LT}(m)$ is an estimation of the phase error suffered by the slip buffer in the SPCMI. The period of time over which the phase error is estimated is variable from the time of the most recent slip in the slip buffer to the time the most recent phase difference signal is sampled. This long term phase estimation is produced by processing the output of the multistate phase filter by an FIR low pass filter.

The frequency error estimation $f_{LT}(m)$ is used to monitor the current frequency error of the oscillator output. The period of time over which the frequency error is estimated is 4 to 5 times of the period of highest state filter in the multistate frequency error filter. The special frequency estimation $f_{LT}(m)$ is produced by processing the output of the multistate frequency error filter by an FIR low pass filter with a similar filter architecture as the frequency filter in the Pre-FLL initialization stage.

During normal operation, multiple PLL and FLL modes can be selected. Note that in a preferred embodiment, a single physical feedback loop is used for each of the multiple modes of operation, wherein the different modes of operation are selected by selecting various thresholds. An example of the type of auto-adjustment processing logic for a system having one FLL mode and 3 PLL modes is:
IF (DAC_in_Delta_freq=0) OR (($|f_{LT}(m)|$<=Th_f_LT)
    AND ($\phi_{LT}(m)$>Th_$\phi$_LT 1) AND ($\phi_{LT}(m)$<=Th_$\phi$_LT 2)))
    Then Sync turns in PLL1 mode and DAC_Delta=DAC_Delta_phase;
ELSEIF (($|f_{LT}(m)|$<=Th_f_LT) AND ($\phi_{LT}(m)$>Th_$\phi$_LT 2) AND ($\phi_{LT}(m)$<=Th_$\phi$_LT 3))
    Then Sync turns in PLL2 mode and DAC_Delta=DAC_Delta_phase;
ELSEIF (($|f_{LT}(m)|$<=Th_f_LT) AND ($\phi_{LT}(m)$>Th_$\phi$_LT 3))
    Then Sync turns in PLL3 mode and DAC_Delta=DAC_Delta_phase;
ELSEIF (($|f_{LT}(m)|$<=Th_f_LT) AND ($\phi_{LT}(m)$<Th_$\phi$_LT 0))
    Then Sync turns out PLL1 into FLL mode and DAC_Delta=DAC_Delta_freq;
ELSE Sync turns in FLL mode and DAC_Delta=DAC_Delta_freq;

The $f_{LT}(m)$ is a long term frequency error estimation, and the $\phi_{LT}(m)$ is a long term phase error estimation.

The Th_$\phi$_LT 1 is the threshold on phase for Sync module to select the PLL1 mode.

The Th_$\phi$_LT 2 is the threshold on phase for Sync module to select the PLL2 mode.

The Th_$\phi$_LT 3 is the threshold on phase for Sync module to select the PLL3 mode.

The Th_f_LT is the threshold on frequency for Sync module to select the FLL mode.

The Th_$\phi$LT0 is the threshold on phase for Sync module to get back to the FLL mode from the PLL1 mode.

After the FLL and PLL mode auto_switching processing, the DAC_in updating processing is simple, i.e., DAC_in=DAC_in+DAC_Delta.

The DAC_in_Delta_phase updating processing logic is:
IF (($\phi_{er}(m)$>Th_$\phi$n) AND (DAC<DAC_Max))
    Then DAC_Delta_phase=+1;
ELSEIF (($\phi_{er}(m)$>−Th_$\phi$n) AND (DAC>DAC_Max))
    Then DAC_Delta_phase=−0;
ELSE DAC_Delta_phase=0;

DAC_in_Max and DAC_in_Min are the acceptable maximum and minimum input values of the DAC_in, and are determined by the oscillator selected.

The DAC_in_Delta_freq updating processing logic is:
IF (($f_{er}(m)$>0) AND (DAC<DAC_Max))
    Then DAC_Delta_freq=+1;
ELSEIF (($f_{er}(m)$<0) AND (DAC>DAC_Min))
    Then DAC_Delta_freq=−1;
ELSE DAC_Delta_freq=0;

As can be seen, the system remains in the FLL mode if the frequency error estimate is greater than the Th_f_LT threshold in order to satisfy the system frequency requirements. Advantageously, if the frequency error is within satisfactory bounds, the system operates within multiple PLL modes to control the phase error in order to try and prevent slipping. As should be appreciated by a person skilled in the art, while the phase is being controlled, the frequency can drift. The amount the frequency is allowed to drift depends on how close the system is to slipping. The closer the system is to slipping, the more flexibility is given to the system to make phase adjustments (at the expense of tolerating more frequency drift, within limits). Thus PLL3 mode allows more phase control (and frequency drift) than PLL1 mode, because PLL3 is closer to a slip, according to the $\phi_{LT}(m)$ long term phase error estimation.

We have found the following example thresholds provide satisfactory performance:

Th_$\phi$_LT 1 is defined as 11 micro seconds;
Th_$\phi$_LT 2 is defined as 55 micro seconds;
Th_$\phi$_LT 3 is defined as 95 micro seconds;
Th_f_LT is defined as 30 ppb;
Th_$\phi$_LT 0 is defined as 5 micro seconds;

n the PLL1 mode, the DAC_in range is bounded by +/−15 counts which equals about a frequency range of +/−11 ppb;

In the PLL2 mode, the DAC_in range is bounded by +/−39 counts which equals about a frequency range of +/−35 ppb; and In the PLL3 mode, the DAC_in range is bounded by +/−70 counts which equals about a frequency range of +/−50 ppb.

Note that these DAC_in bounds can also be limited based on the DAC_in_aging values.

6) Aging Processing

Figure 8:
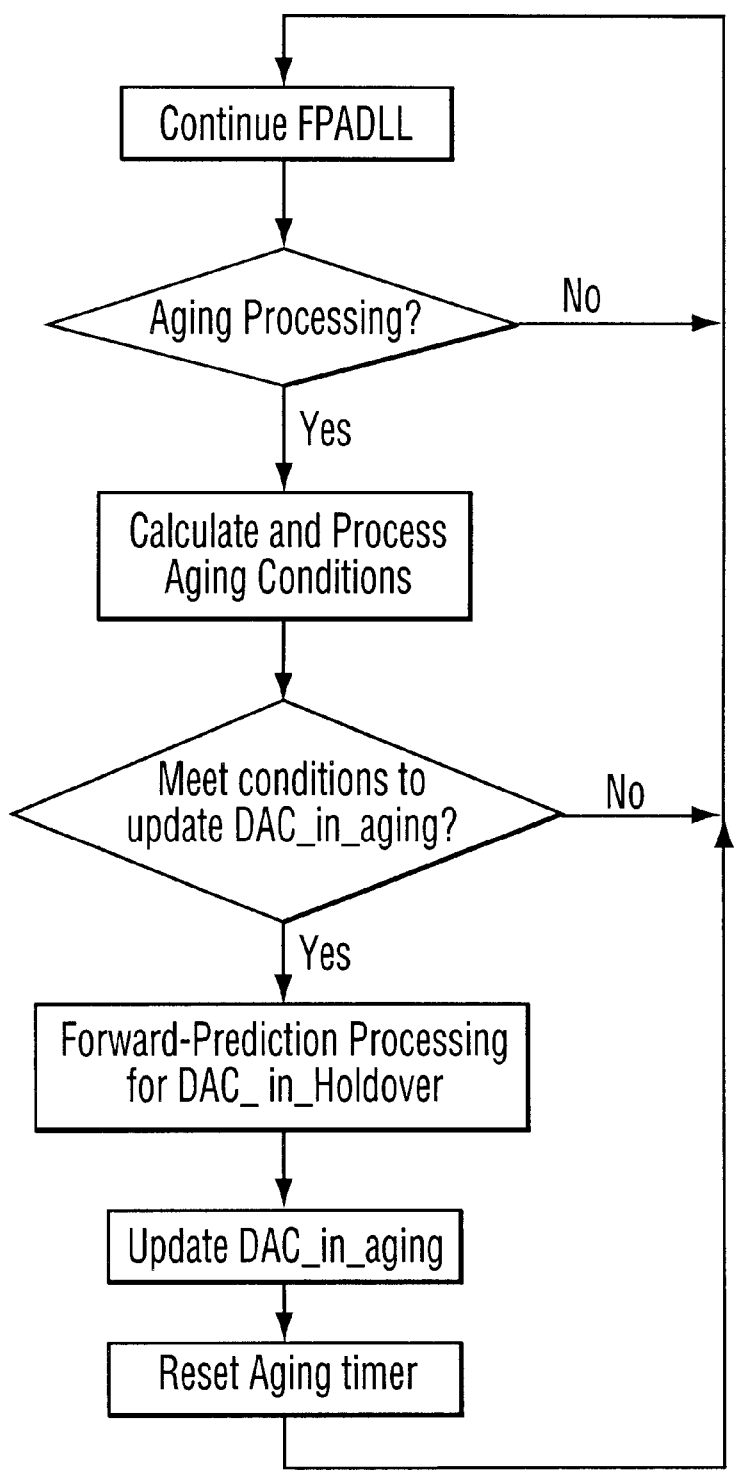
FIG. 8 illustrates the aging processing steps for the method of FIG. 7.

We will discuss the aging processing steps below with reference to FIG. 8. Note that for ease of reference, Aging Processing is shown as a step which is executed during every iteration (i.e., for every multistate filter output) of FIG. 7, however as can be seen in FIG. 8, the process is really only executed if the conditions for Aging processing have been met.

Periodically during the FPADLL processing, the system processing performs additional aging processing. This aging processing is illustrated in FIG. 8, which shows the details of the aging processing step of FIG. 7. The aging processing occurs at regular intervals during normal FPADLL operation. Unless an aging timer (not shown) has expired, FIG. 7 processing effectively skips the aging processing steps, as the aging processing enquiry of FIG. 8 promptly returns processing to FIG. 7. The timer interval is preferably set between 24 and 72 hours.

The purpose of the aging processing is to monitor how aging affects the system and to record this information for use during the initialization and holdover steps. The aging processing procedure is started based on an aging timer interval expiring, and continues until a new DAC_in_aging value is successfully found. Thus, once the aging timer has expired, each iteration of FIG. 7 includes a branch to FIG. 8 until the conditions to update DAC_in_aging have been met.

Once these conditions are satisfied, the newly calculated DAC_in_aging will be recorded together with the previous old DAC_in_aging values. Sufficient Flash memory is preferably reserved to store aging information to predict the OCVCXO aging affects over the expected life of the OCVCXO.

The Calculate and Process Aging conditions step, is used to determine a special DAC_in value, which we call, DAC in_aging, which satisfies the following conditions defined in terms of:

the mode of the locked loop;
the multistate filter state in which it operates;
the absolute DAC_in variation in the recent filter periods;
the DAC_in variation directions;
the phase error estimation;
the frequency error estimation;
the temperature range;

For example, the DAC_in_aging will be obtained as the final DAC_in and will be stored in flash memory as long as the following conditions are met:

the absolute DAC_in variation should be smaller Ndac_ nor during the past Nnor frequency filter periods (wherein the subscript nor stands for normal operation);

the DAC_in variation should change its direction at least more than two times over the same Nnor frequency filter periods;

the FPADLL should operate in FLL mode during the past Nnor frequency filter periods.

the multistate frequency filter should keep its operation in its highest state during Nnor frequency filter periods;

the maximum absolute phase error estimation should be smaller than $\Phi$max_nor during Nnor frequency filter periods;

the maximum absolute frequency error estimation should be smaller than Fmax_nor during Nnor frequency filter periods;

the temperature measured should be between −20 C. and +55 C.

In this embodiment, Ndac_nor=2, Nnor=10, $\Phi$max_nor= 3.7 micro seconds, and Fmax_nor=5 ppb.

This history effectively records the aging affects on the oscillator by recording the feedback controls required to compensate for the aging during normal ongoing operation. Note that assuming a stable and accurate T1 reference signal, the stored DAC_in_aging values represent the control signal which was required to compensate for the aging of the crystal at that time.

Advantageously, as well as recording the DAC_in_aging value, forward linear prediction is applied to the stored history of DAC_in_aging values in order to determine the best estimation of DAC_in_holdover to be used as set out below. In brief, the stored history of DAC_in_aging values is used to predict the value of DAC-in to be used in the event the T1 reference clock is lost or suffers inaccuracies during the next Timer interval. In this embodiment, a 32 Tap adaptive forward linear prediction filter is used.

Once the system has competed the update DAC_in_ aging step by storing the newly calculated DAC in_aging_ value, the aging timer is reset, which effectively stops FIG. 7 processing from branching to FIG. 8 until the timer interval expires again.

Holdover

Holdover is a state in which the Sync module provides its frequency estimate when the T1 input reference clock is either inaccurate/unstable or is lost.

In holdover state, Sync Controller selects an open loop mode of operation (as there is no reliable reference clock to lock to).

Figure 9:
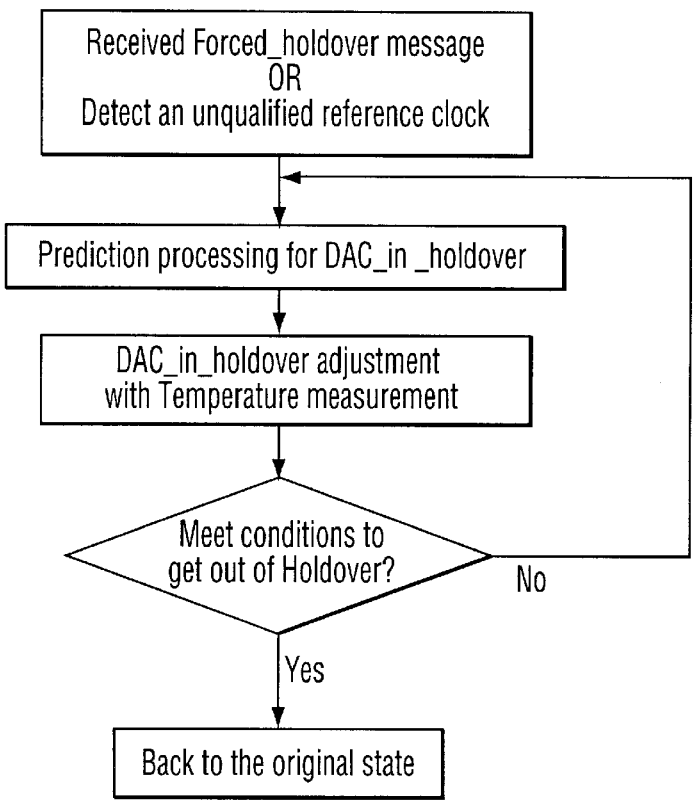
FIG. 9 illustrates the holdover procedure steps of the holdover procedure of FIG. 4.

The holdover operation procedure is illustrated in FIG. 9. As shown in FIG. 8, a forward linear prediction process is applied to the recorded DAC_in_aging sequence in order to determine an estimation of the value of DAC_in_ holdover in the event of a holdover.

This predicted value is retrieved when the system first selects the Holdover (open loop) mode of operation during the initial Prediction Processing for DAC_in_holdover step. Then, for each subsequent iteration, the predicted DAC_in_holdover value is adjusted based on measurable conditions, for example the measured temperature. These adjustments are made at the same rate as the highest state operation rate of the multistate filters.

These steps continue until the conditions for Sync module to return to its original state from holdover state (called Holdover_out) are satisfied. These conditions are based on determining the quality of any received T1 reference signal has improved until the above described fault detection conditions are no longer satisfied. Specifically, the holdover_out condition transition logic is:

IF (a lost_Reference_Fault_Condition is NOT detected)
AND (Forced_holdover message is NOT received)
THEN Switch back to original state.

Note a Forced_holdover message is a message received from the network indicating there is a problem and the sync system should remain in the holdover state.

Figure 10:
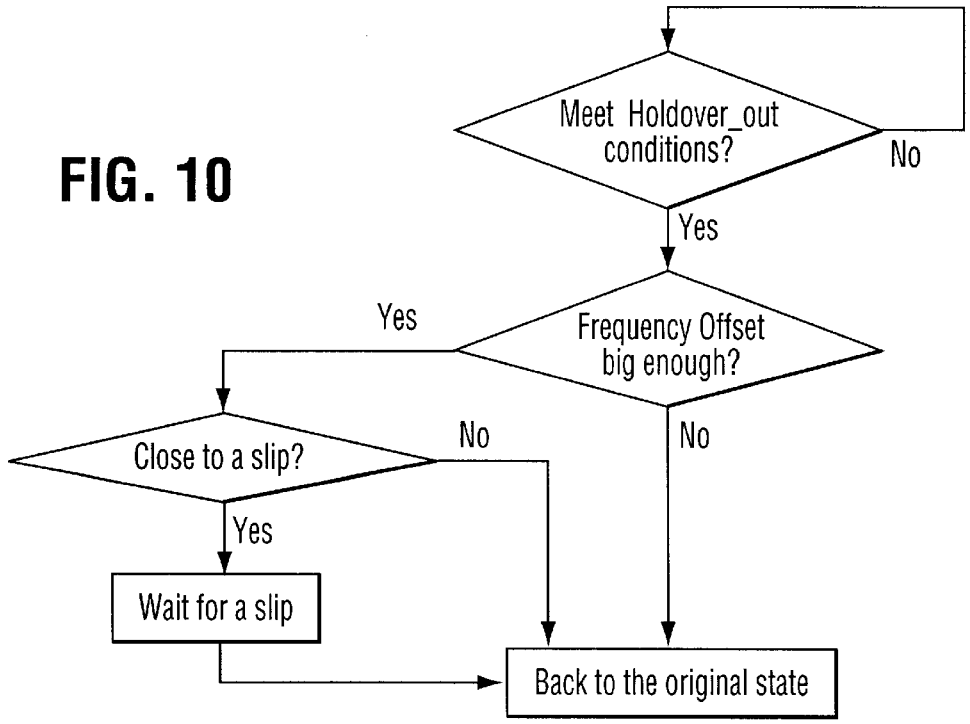
FIG. 10 is a flowchart of the holdover_out steps (i.e. the steps taken by the Sync module controller to switch back to its original state from a holdover state) according to a preferred embodiment of the invention.

The Holdover_out procedures are shown in FIG. 10, wherein the system first checks if the system is close to a slip, based on the frequency and the phase error estimates as described above with reference to slipping.

The Lost_Reference_Fault_Condition and the Bad_Reference_Fault_Condition are described above in the Fault Detection section.

Many variations are possible. For example, we described preferred embodiments which use a phase detector including phase comparator and divider logic for both the PLL and FLL. However, this apparatus is not necessary to practice the invention as claimed. For example, other phase detectors can be used for producing the described phase difference samples. Furthermore, with suitable modifications based on providing the controller with frequency difference samples rather than phase difference samples, it is possible to use a frequency detector/frequency comparator instead.

As another example, instead of an analog OCVCXO, a digital VCO can be used for applications where output jitter is not a significant concern, or for circuits which compensate for jitter.

As a further example, as an alternative to the filters described in FIG. 10 and 11, simpler filter structures can be used. For example, a simpler frequency filter can simply take the difference of the first and last phase signal samples over the period of the filter length in the state, whereas simply accumulating all the phase signal samples over the period of the filter length in the state can provide adequate phase filters.

Numerous modifications, variations and adaptations may be made to the particular embodiments of the invention described above without departing from the scope of the invention, which is defined in the claims.

What is claimed is:

1. A synchronization system comprising:
    a reference signal recovery unit for recovering a reference signal, said reference signal having phase and frequency signal characteristics, said recovery unit including a slip buffer;
    a controllable signal source for producing an output signal having phase and frequency signal characteristics;
    a signal detector connected to an output of said recovery unit and an output of said controllable signal source, said signal detector detects signal differences in one of said signal characteristics between said output signals, and produces a difference signal indicative of said differences; and
    a controller connected to receive said difference signal as an input and to receive an indication from the recovery unit when a slip occurs and for producing a control signal for controlling said controllable signal source in order to reduce slipping.

2. A synchronization system as claimed in claim 1, wherein said controllable signal source comprises a controllable oscillator and wherein said signal detector comprises a phase detector for producing a phase difference signal indicative of the phase difference between said oscillator output and said reference signal and wherein said controller further comprises means for processing said difference signal in order to estimate a long term phase error in order to determine whether the system is approaching a slip.

3. A synchronization system as claimed in claim 2 further comprising means for resetting said estimate of the long term phase error whenever an indication of a slip is received and sending a reset signal to said phase detector.

4. A synchronization system as claimed in claim 3, wherein said controller maintains multiple threshold levels for controlling said oscillator and determines which threshold level to use based on said estimate of the long term phase error.

5. A synchronization system as claimed in claim 3, wherein said means for processing said difference signal in order to estimate the long term phase error in order to determine whether the system is approaching a slip includes means for determining the value of said the long term phase error and the direction of change of said long term phase error.

6. A synchronization system as claimed in claim 5, wherein said controller maintains multiple threshold levels for controlling said oscillator and determines which threshold level to use based on the determined value and direction of change of the long term phase error.

7. A synchronization system as claimed in claim 3, wherein said controller includes means for forcing a slip to occur during initialization.

8. A synchronization apparatus for synchronizing a locally generated signal in a network element with other network elements comprising:
    reference signal means for receiving a reference signal from at least one other network element, said reference signal having phase and frequency signal characteristics, said reference signal including a slip buffer;
    controllable signal means for producing an output signal having phase and frequency signal characteristics;
    signal detector means, connected to an output of said reference signal means and an output of said controllable signal means, for detecting signal differences in one of said signal characteristics between said output signals, and for producing a difference signal indicative of said differences; and
    control means, connected to receive said difference signal as an input and to receive an indication from the reference signal means when a slip occurs, for producing a control signal for controlling said controllable signal means in order to reduce slipping.

9. A synchronization apparatus as claimed in claim 8, wherein said controllable signal means comprises a controllable oscillator and wherein said signal detector means comprises phase means for producing a phase difference signal indicative of the phase difference between said oscillator output and said reference signal and wherein said control means further comprises means for processing said difference signal in order to estimate a long term phase error in order to determine whether the system is approaching a slip.

10. A synchronization apparatus as claimed in claim 9 further comprising means for resetting said estimate of the long term phase error whenever an indication of a slip is received and sending a reset signal to said phase detector.

11. A synchronization apparatus as claimed in claim 10, wherein said control means includes means for maintaining multiple threshold levels for controlling said oscillator and determines which threshold level to use based on said estimate of the long term phase error.

12. A synchronization apparatus as claimed in claim 11, wherein said means for processing said difference signal in order to estimate the long term phase error in order to determine whether the system is approaching a slip includes means for determining the value of said the long term phase error and the direction of change of said long term phase error.

13. A synchronization 14 as claimed in claim 12, wherein said control means includes means for maintaining multiple threshold levels for controlling said oscillator and determines which threshold level to use based on the determined value and direction of change of the long term phase error.

14. A synchronization apparatus as claimed in claim 10, wherein said control means includes means for forcing a slip to occur during initialization.

15. A synchronization apparatus as claimed in claim 13, wherein said control means includes means for forcing a slip to occur during initialization.

* * * * *